US012772888B2

(12) United States Patent
Chen

(10) Patent No.: US 12,772,888 B2
(45) Date of Patent: Oct. 20, 2026

(54) COMPONENT CARRIER WITH MOUNTING PROTRUSION

(71) Applicant: AT&S Austria Technologie & Systemtechnik Aktiengesellschaft, Leoben (AT)

(72) Inventor: Lonis Chen, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 431 days.

(21) Appl. No.: 18/366,749

(22) Filed: Aug. 8, 2023

(65) Prior Publication Data

US 2025/0054820 A1 Feb. 13, 2025

(51) Int. Cl.

*H10W 70/68* (2026.01)
*H10W 70/69* (2026.01)
*H10W 99/00* (2026.01)
*B33Y 80/00* (2015.01)

(52) U.S. Cl.

CPC ........... *H10W 70/68* (2026.01); *H10W 70/69* (2026.01); *H10W 99/00* (2026.01); *B33Y 80/00* (2014.12)

(58) Field of Classification Search

CPC ..................................................... H10W 70/68
USPC ......................................................... 257/678
See application file for complete search history.

(56) References Cited

U.S. PATENT DOCUMENTS

| | | | |
|---|---|---|---|
| 10,064,292 B2 | 8/2018 | Pen | |
| 2001/0054481 A1 | 12/2001 | Harada et al. | |
| 2014/0158414 A1 | 6/2014 | Baldwin et al. | |
| 2020/0126917 A1* | 4/2020 | Kaeding | H01L 21/6835 |
| 2022/0189789 A1 | 6/2022 | Chen et al. | |

FOREIGN PATENT DOCUMENTS

| | | | |
|---|---|---|---|
| CN | 104582273 A | 4/2015 | |
| DE | 102012203318 A1 | 6/2013 | |
| EP | 3361841 B1 | 7/2020 | |
| JP | 2001244333 A * | 9/2001 | H01L 24/82 |

* cited by examiner

*Primary Examiner* — Ajay Arora

(74) *Attorney, Agent, or Firm* — Robert A. Blaha; Smith Tempel Blaha LLC

(57) ABSTRACT

A component carrier includes a stack having at least one electrically conductive layer structure and at least one electrically insulating layer structure and a mounting region arranged at the stack. The mounting region configured for mounting a component thereon and having at least one mounting protrusion for insertion of the component in at least one mounting recess.

20 Claims, 7 Drawing Sheets

COMPONENT CARRIER WITH MOUNTING PROTRUSION

TECHNICAL FIELD

Embodiments disclosed herein relate to a component carrier and a method for manufacturing a component carrier, respectively.

BACKGROUND ART

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) becomes an increasing issue. At the same time, component carriers shall be mechanically robust and electrically and magnetically reliable so as to be operable even under harsh conditions.

In particular, mounting a component (e.g., an electronic component such as a chip) at a component carrier, and specifically further stable interconnection between them, may be considered an issue. For example, a component can be surface-mounted to the component carrier. In this case, the component can be attached e.g., using soldering. In another example, a component can be at least partially embedded in a component carrier cavity. In this case, an interconnection may be established for example by an adhesive layer or by encapsulating the component in component carrier material.

However, conventional approaches of mounting components on component carriers are still challenging, in particular with respect to stability, reliability, and electrical interconnection.

SUMMARY

There may be a need to mount a component at a component carrier in an efficient and robust manner.

A component carrier and a method of manufacturing are provided.

According to an aspect of the disclosure, a component carrier (e.g., a printed circuit board or an IC substrate) is provided which comprises a (multi-layer) stack with i) at least one electrically conductive layer structure (e.g., copper traces, pad, via) and at least one electrically insulating layer structure (e.g., a resin), ii) a mounting region at the stack (e.g., on or in (a cavity of) the stack), configured for mounting a component thereon, and comprising at least one mounting protrusion (e.g., a vertically extending pillar-like structure) for insertion of the component in at least one mounting recess of the component carrier.

According to another aspect of the disclosure, a method of manufacturing a component carrier is provided, wherein the method comprises:

i) providing a stack comprising at least one electrically conductive layer structure and at least one electrically insulating layer structure; and ii) forming a mounting region at the stack for mounting a component, wherein forming the mounting region comprises forming at least one mounting protrusion configured for insertion of the component in at least one mounting recess of the component carrier.

Overview of Embodiments

In the context of the present document, the term "mounting region" may particularly denote any region of a component carrier configured for reliably mounting and efficiently electrically connecting of a component on a component carrier. Additionally and/or alternatively, the mounting region may be configured to interconnect for example two PCBs, a PCB and an IC substrate, or an IC substrate with an interposer. Thereby, the mounting region may be arranged at any surface inside or outside of the component carrier. In a first example, the mounting region may be located at the upper and/or lower main surface of the stack. In a second example, the mounting region may be located in a cavity of the stack. In a third example, the mounting region may be located at a (outer) sidewall of the stack. The mounting region might comprise pure metal (e.g., copper) formed by plating or the mounting region might comprise metal and insulting material (e.g., copper coating the surface of the insulating material).

In the context of the present document, the term "mounting protrusion" may particularly denote any kind of protrusion arranged at or on the mounting region and configured to be at least partially inserted in a mounting recess, in particular in order to reliably mount (physically connect) and efficiently electrically (and/or thermally and/or optically) connect the component to the component carrier. In an example, wherein the mounting protrusion extends in the vertical direction, a height of the mounting protrusion is larger than its width or length. The protrusion may also comprise a stepped edge (step-like shape) or have a conical shape in the vertical direction. With regard to the top view of the mounting protrusion, it may comprise any kind of shape, for example a round, oval, rectangular, triangular, polyangular, square, or even star-like shape. In an example, the mounting protrusion may comprise at least one direction of main extension (for example in the z-direction but depending on its special orientation). In this manner, the protrusion may be inserted in a corresponding recess along said direction of main extension.

In the context of the present document, the term "mounting recess" may particularly denote any kind of recess arranged at or in a component and configured for accommodating at least a part of the mounting protrusion inside of the mounting recess. Thereby, the mounting recess may be arranged at any part of a component suitable to be, in particular electrically, connected to the component carrier/stack. Further, the mounting recess may not be limited and comprise any shape, for example a round, oval, rectangular, triangular, polyangular, square, or even star-like shape. In particular the shape of mounting protrusion and mounting recess is comparable to enable a stable fit. Thereby, the shape of the mounting recess may be the same or different from the shape of the mounting protrusion with regard to the top view or any other view.

In the present context, the terms "protrusion" and "recess" may be closely related. For example, a space between a sidewall and a protrusion or a space between two protrusions may resemble a recess. In the same manner, the sidewall that delimits a recess may resemble protrusions. Exemplary examples are shown in FIGS. 6 and 7: between two protrusions of the component carrier, a recess can be formed. Further, next to the recess of the component (that corresponds to the protrusion of the component carrier), a protrusion may be formed (that delimits the recess). According to such examples, both the component carrier and the component, may comprise a recess and a protrusion, respectively.

In the context of the present document, the term "component carrier" may particularly denote any support structure which is capable of accommodating one or more components thereon and/or therein for providing mechanical support and/or electrical and/or thermal connectivity. In other words, a component carrier may be configured as a mechanical and/or electronic and thermal carrier for components. In particular, a component carrier may be one of a printed circuit board, an organic or inorganic interposer, and an IC (integrated circuit) substrate. A component carrier may also be a hybrid board combining different ones of the above mentioned and/or other types of component carriers. It may refer to a final component carrier product as well as to a component carrier preform (i.e., a component carrier in production, in other words a semi-finished product). In an example, a component carrier preform may be a panel that comprises a plurality of semi-finished component carriers that are manufactured together. At a final stage, the panel may be separated into the plurality of final component carrier products. It comprises at least one electrically conductive structure and at least one electrically insulating structure. It can function as an electrical and/or mechanical and/or thermal platform in an IC package when the components are mounted on the component carrier or embedded in the component carrier.

In an embodiment, the component carrier comprises a (layer) stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. It comprises different elements connected together with electrical conductivity and insulation by vias, pads, traces and/or bumps and insulating layers.

In the context of the present document, the term "stack" may particularly denote an arrangement of multiple planar layer structures which are arranged in parallel on top of one another.

The term "layer structure" may particularly denote a continuous layer, a patterned layer, a discontinuous layer, or a plurality of non-consecutive islands within a common plane. The layer structure may comprise an electrical element and/or insulating element integrated to realize the function of electrical connection of different layers and/or within one layer.

In the context of the present document, the term "laminating" may particularly denote connecting layer structures, such as layers, by the application of mechanical pressure and/or heat.

According to an exemplary embodiment, the disclosure may be based on the idea that a component can be mounted at a component carrier in an efficient and robust manner and electrically connected with a component carrier in a reliable manner, when the component carrier comprises a mounting region that is equipped with a mounting protrusion that is insertable into a corresponding mounting recess of the component to be mounted.

Conventionally, as elucidated above, a component is mounted by soldering, adhesive films, or encapsulating material. Nevertheless, these established approaches may have drawbacks regarding stability of the interconnection and also quality of electrical interconnection.

The described interconnection is a straightforward and easy approach, that is, however, surprisingly efficient and robust. By inserting one or more protrusions into recesses, the component can be mounted and held in place in a very stable manner. The design flexibility may be high since a protrusion/recess interconnection may be applied essentially anywhere at the component carrier.

Furthermore, the protrusion (and the recess) may be equipped with electrical connections (e.g., pads), so that an efficient and reliable electrical interconnection via the protrusion/recess connection may be enabled. The protrusion may be manufactured with established component carrier manufacture techniques (e.g., cavity formation based on a release layer), so that the described highly efficient interconnection may be implemented in existing production lines in a straightforward manner.

In the following, further exemplary embodiments of the component carrier and the method will be explained.

According to an exemplary embodiment, the component carrier comprises the component having the at least one mounting recess and being mounted at the mounting region, wherein the at least one mounting protrusion is at least partially inserted into (formed in) the at least one mounting recess. This may allow a secure attachment and a reliable electrical connection between the component and the component carrier. In particular, it may be advantageous in comparison with conventional techniques of mounting a component onto a component carrier during the manufacturing process.

In an example, the mounting protrusion may occupy the entire volume created by the mounting recess (recess volume). In another example, at least 5% of the volume created by the mounting recess (recess volume) may be free from the mounting protrusion.

According to another exemplary embodiment, the component is an electronic component, in particular an active component or a passive component, or a thermally conductive block. This may provide the advantage that economically important components can be directly applied.

In the context of the present document, the term "electronic component" may particularly denote a component configured to perform specific functions to control, manipulate or transmission of electronic signals.

In the context of the present document, the term "electronic component" may particularly denote any component fulfilling an electronic task. For instance, such an electronic component may be a semiconductor chip comprising a semiconductor material, in particular as a primary or basic material. The semiconductor material may for instance be a type IV semiconductor such as silicon or germanium or may be a type III-V semiconductor material such as gallium arsenide. In particular, the semiconductor component may be a semiconductor chip such as a naked die or a molded die.

In the context of the present document, the term "thermally conductive block" may particularly denote a device or material configured to establish a thermal pathway and facilitate the efficient heat transfer in the component carrier. For that purpose, the component may comprise high thermal conductivity material, e.g., copper or aluminum (e.g., a copper block). Such a component may be used together with other thermal management solutions, e.g., heat sinks, heat pipes, fans, thermal interfaces, cooling structures. It can help dissipate the heat of the component and/or component carrier and/or the whole package.

The component carrier may further comprise a combination of different components.

According to another exemplary embodiment, the component is an optical component. In the context of the present document, the term "optical component" may particularly denote a component that performs an optical functional. In particular, such an optical component may be configured for detecting, receiving, amplifying, modulating, or otherwise processing an optical signal, and more particularly for converting the received optical signal into an electric signal by an electrooptical converter. For example, the optical component may be one of the group of an optical waveguide, a photodetector, an optical modulator, an optical filter, an optical couplers/splitters, an optical isolator or even an optical processor.

Thus, efficient transmission, manipulation, and detection of optical signals may be ensured. The optical component can provide a much faster optical signal transmission than the electronic signal transmission and it can store/process more information at one time. Additionally, it can reduce the power dissipation and provide a better signal integrity and lower latency due to the ohmic loss absence in the optical signal transmission. It can be used in diversified applications especially in high-performance computing, such as AI, to improve the data computing ability for those application requesting, e.g., large data-rates and/or 5G/6G communication technology.

It is also possible that the electronic component comprises a drive functionality, in particular for driving an optical component. The component may be an electro-optical component (e.g., an electro-optical modulator, an optical transmitter, a photodetector, an optical amplifier), in particular providing an integration of both electrical and optical functions, facilitating the interaction and conversion between electrical and optical signals. This may allow secure detection, transmission, conversion of light signals in an electro-optical system.

The optical component and the electronic component may be interconnected for functionally cooperating with each other. For instance, signal transmission (in particular, electric signal transmission and/or optical signal transmission) may be enabled between the optical component and the electrical component. For instance, one of said components may drive the other one. It is also possible that one of the components processes signals provided by the other one. The two components can be assembled in the same package, which provides much better performance than the conventional application (optical component package is separated from the electronic component). With such kind of structure, the signal transmission and signal integrity will be significantly improved as the signal path is shortened a lot compared with the conventional technology (using the fiber cable to connect the optical modules and electronic components in a long distance). It contributes to the development of huge data processing area such as generative artificial intelligence.

According to another exemplary embodiment, the component is a heat generating component. For example, the component that generates a significant amount of heat may be one of a central processing unit (CPU), a graphics processing unit (GPU), a power amplifier, a memory module and/or the whole package.

According to another exemplary embodiment, the at least one mounting protrusion is configured for dissipating heat, when the component is mounted at the mounting region with the at least one mounting protrusion inserted in the at least one mounting recess.

In an example, one mounting protrusion may be configured for dissipating heat. In a further example, a plurality, in particular two, more in particular five, mounting protrusions may be configured for dissipating heat.

In this regard, the mounting protrusion is configured to remove heat generated by the component(s) mounted at the mounting region. Thus, the mounting protrusion may maintain the operating temperature within the mounting region and the component carrier, in order to ensure its optimal performance and prevent excessive heat and potential damage due to overheating.

According to another exemplary embodiment, the mounting region comprises at least two mounting protrusions, wherein the component comprises at least two mounting recesses, and wherein each mounting protrusion is at least partially inserted into an associated mounting recess. In this manner, the component may be efficiently attached to the component carrier at several sections of the mounting region, thus facilitating both a secure mechanical and an efficient and stable electrical connection between the component and the component carrier.

According to another exemplary embodiment, the component carrier further comprises at least two cavities, wherein each cavity comprises at least one mounting region provided with at least one protrusion. This may provide the advantage that more small components with different functions may be integrated in the same package, thereby increasing the design flexibility and functionality.

According to another exemplary embodiment, one of the at least two mounting protrusions may optically connect the component carrier with the component, whereas the other mounting protrusion may electrically connect the component and the component carrier. Thereby, a stable electrical and optical connection between the component and the component carrier may be secured.

According to another exemplary embodiment, one of the at least two mounting protrusions may enable an optical connection with the component (in particular coupled with an optical connection between component and stack), while the other mounting protrusion may enable an electrical connection with the component. The optical connection and the electrical connection may be coupled/connected in the component and/or in the component carrier stack.

The mounting protrusions may be arranged at the mounting region in a row or in a staggered manner in different directions, which further facilitates a secure attachment and a reliable electrical connection between the component and the component carrier. Further, a distance between the mounting protrusions may defer depending on the size of the component and the component carrier.

According to another exemplary embodiment, the at least two mounting protrusions are arranged side by side and extend essentially parallel with respect to each other. This increases the contact area between the stack and the component, thus allowing a secure electrical and mechanical connection between them. Thereby, the protrusions may have the same or different height and/or width (and/or the same shape or a different shape), which may facilitate a secure electrical and mechanical connection between different parts of the stack and the component.

In an example, the at least two mounting protrusions may protrude from a same (horizontal) level (perpendicular to the level plane) (of the mounting region). In a different example, the at least two mounting protrusions may protrude from different (horizontal) levels (perpendicular to the parallel arranged level plans) (of the mounting region). For example, a first mounting protrusion may protrude from the bottom of the cavity, while a second mounting protrusion may protrude from an elevated position within the cavity (for example the elevated position may be realized by a pillar- or block-like elevation structure below the mounting protrusion). In an example, the elevation structure may comprise a larger or smaller width (in the horizontal direction) than the mounting protrusion on top.

According to another exemplary embodiment, the component carrier further comprises a cavity arranged in the stack, wherein the mounting region is at least partially located in the cavity. Thereby, the mounting region may extend within an entire volume of the cavity or within the parts of the cavity, thereby potentially ensuring a secure mechanical and/or electrical connection between the component carrier and the component. The cavity may hereby serve as an additional protection structure. Further, electrical connections directly within the stack (i.e., in the cavity) may be more efficient and better protected.

According to another exemplary embodiment, the mounting protrusion is arranged on the bottom of the cavity. Thereby, the mounting protrusion may be arranged in the middle of the cavity or in other regions of the bottom of the cavity. Accordingly, the mounting protrusion may be arranged at the region, where the component carrier (stack) is to be mechanically and/or electrically connected to the component. Additionally or alternatively, the mounting protrusion may be arranged at another part of the cavity, e.g., at cavity side-walls. This may facilitate an additional/alternative secure mechanical and/or electrical connection of the component carrier (stack) with the component.

According to another exemplary embodiment, the mounting protrusion extends within the volume of the cavity (parallel to the cavity side-walls), in particular the extension of the mounting protrusion is restricted by the volume of the cavity (in particular the protrusion height in the cavity is similar to the height of the cavity side-walls or smaller). This construction of the mounting protrusion may allow a secure electrical and mechanical connection between the stack and the component, whereby the connection area between the stack and the component may be at least partially within the cavity.

According to another exemplary embodiment, the mounting protrusion comprises at least one vertical through connection. This allows both for a mechanically reliable connection and a better signal integrity by providing a short and direct path for electrical signals. A cross-section of the vertical through connection may be constant or change continuously or discretely along a length direction of the mounting protrusion. Besides that, cross-section of the vertical through connection may vary in shape (e.g., round, square, oval). In this configuration, the protrusion may serve also as an electrical connection that directly contacts a component inside the recess and extends the electrical connection into the stack.

According to another exemplary embodiment, the mounting region is at least partially located at an exterior main surface of the stack. A secure mechanical and/or electrical connection between the component and the component carrier (the exterior main surface of the stack) may be ensured and it can also improve the yield from the product manufacturing point of view with the chip last solution. Alternatively or additionally, the mounting region may be located at the side surface of the stack, ensuring a secure mechanical and/or an efficient and stable electrical connection between the component and the component carrier (the side surface of the stack).

In the present context, the term "main surface" may in particular refer to an external stack surface that is oriented perpendicular to the stacking direction (generally z) and parallel to the directions of main extension (generally along the x-y plane). A "side surface" would be an external stack surface perpendicular to the main surface.

According to another exemplary embodiment, the at least one mounting protrusion comprises at least one electric contact for electrically contacting at least one electrically conductive structure, in particular electric pad, of the component, in particular when the at least one mounting protrusion is inserted in the at least one mounting recess. This may ensure a reliable (and well protected) electrical short-path direct connection between the component carrier and the component.

According to another exemplary embodiment, the electric contact is an electrically conductive structure and/or an electrical pad. This allows for secure bonding and a robust electrical and/or mechanical connection between the component carrier and the component.

In an example, the electric contact may be permanent, for example comprising an alloy or solder. In another example, the electric contact may be non-permanent, for example having no physical or chemical interconnection. Yet in another example, the electric contact may comprise metal, for example copper, tin, aluminum, gold, silver, palladium.

According to another exemplary embodiment, the electric contact is arranged on a top of the mounting protrusion. This may allow a short-path direct (and well protected) electrical contact between the component carrier and the component. Additionally or alternatively, the electric contact may be arranged at another parts of the mounting protrusion. This may allow an additional/alternative efficient and stable electrical connection of the component carrier (stack) with the component.

According to another exemplary embodiment, the electric contact covers the top of the mounting protrusion. Covering the full area of the mounting protrusion with the electric contact facilitates a secure and reliable connection between the component carrier with the component, using the whole connection area. Thereby, the top of the mounting protrusion may comprise a wide range of shapes and sizes.

According to another exemplary embodiment, the electric contact extends over the main part of, in particular the whole, surface of the protrusion (for example the upper main surface). For example, a main part, in particular the whole, protrusion may be formed of metal, in particular pure metal. For example, the protrusion can be formed as a pure metal pillar. In an example, the protrusion can have full electrical connection with the component. This may allow a better heat dissipation (and/or electric connection). Alternatively, the protrusion can be implemented as a portion with insulating material coating the metal (copper) externally.

In another example, a small pillar is formed inside of the protrusion (e.g., insulating material) and covered (at the outer surface) by electric contact(s) at the outside. This may provide the advantage of flexible design for different requirements.

According to another exemplary embodiment, the electric contact is electrically connected with the at least one electrically conductive layer structure of the stack. A width of the electric contact may be at least 20 μm, in particular at least 50 μm. Thereby, the width (perpendicular to the stacking direction) of the electric contact may be equal or narrower than a width of an electrically conductive structure. This may enable a short-path stable direct electrical connection between the stack and the component.

According to another exemplary embodiment, the component comprises at least one further electrically conductive structure, in particular further electric pad, being electrically connected with at least one further electric contact provided at the mounting region apart from the at least one mounting protrusion. Thus, with this additional electrical connection a more design-flexible electrical connection between the component and the component carrier may be ensured.

In an example, the further electrically conductive structure may be located at the opposed (main) side with regard of side of the mounting protrusion.

According to another exemplary embodiment, the further electrically conductive structure is one of a slanted connection, a via, in particular a stacked via, a pillar, a bump. These interconnects may comprise vertical or vertical-horizontal connectors that link different layer of the stack, thus facilitating the transmission of the electrical signals vertically through the multiple layers of the stack.

According to another exemplary embodiment, the component carrier is connected with the component by a redistribution layer.

The term "redistribution layer" may particularly denote a patterned electrically conductive layer which has a portion with a lower pitch as compared to another portion with a higher pitch. Pitch may denote a characteristic distance between adjacent electrically conductive structures, such as wiring elements or terminals. In particular, pitch may denote the distance between electrically conductive structures (such as leads) of a semiconductor chip. By providing spatially separate regions with different pitch, a redistribution layer may be an electric interface between larger dimensioned electric connection structures (in particular relating to component carrier technology, more particularly printed circuit board technology or integrated circuit substrate technology) and smaller dimensioned electric connection structures (in particular relating to semiconductor chip technology, wherein the embedded component may be a semiconductor chip).

In particular, a number of electrically conductive structures per area may be larger in a region with larger pitch than in another region with smaller pitch. A region with larger pitch may be arranged in a center of the main surface of the component, whereas another region with smaller pitch may be arranged at a periphery, a perimeter, or an outer region of the main surface of the component.

In particular, "redistribution" may mean a provision of an electrical connection between a plurality of contacts (preferably contacts provided in an internal area of the stacked layer and/or the component surface) and further displaced contacts (preferably provided on the external profile of a stack layer and/or the component surface).

A "redistribution layer" may mean a common layer where said connection is provided. A task of a redistribution layer may be to rearrange the circuitry of the component to get the signal out from the different portions with different functions inside of the component. Said signals may be transmitted to or interconnected with the stack of the component carrier at same level due to the structure and function inside of the component. It is also possible that sections of an overall redistribution layer are provided by both the component and the component carrier's stack depending on the design and purpose. A function of the redistribution layer may be to rearrange the circuitry and realize interconnection of two different densities of electric connection structures.

Thereby, the redistribution layer may be at least partially arranged at a main surface of the component and/or at a surface of the stack. A redistribution layer or structure may comprise one or more electrically insulating structures and one or more electrically conductive structures (e.g., a metal layer or a stack of metal layers). Such a redistribution layer may be coupled with electrically conductive terminals, pads, or contacts of the component. For example, electrical contacts on top of the component may be electrically connected to the redistribution layer that is placed like a lid on top of the component carrier stack (see, e.g., FIG. 4). In an example, the component inside the cavity has same level connection with the redistribution layer, which can shorten a signal path, for example among the component inside, component mounting outside and the stack/component carrier.

A thickness of the redistribution layer may be in a range from 10 to 30 μm. Such a redistribution layer may be properly functionally effective in connecting the component carrier with the stack, suppressing delamination, and reducing warpage of the component carrier, but does not add a significant contribution to the overall thickness of the consequently highly compact component carrier.

According to another exemplary embodiment, the at least one mounting protrusion is configured for contributing to a transmission of an electrical signal between the component and the stack. In this case, the mounting protrusion provides a low-resistance electrical path for the electrical signal and secures a mechanical connection between the component and the stack.

According to another exemplary embodiment, the component carrier comprises an optical interface for supplying and/or receiving an optical signal at a sidewall of the stack to the component.

In a preferred example, the optical interface for supplying and/or receiving an optical signal may be directly or indirectly connected to a mounting protrusion (via an optical path).

According to another exemplary embodiment, the component carrier comprises an optical path, which optically couples the component with the stack, in particular wherein the optical path is arranged at least partially outside of the stack. Thereby, the optical path can be provided at the bottom or at the top of the mounting protrusion, in particular beside the electrical connection. Thereby, the optical connection between the component and the stack may be implemented in a secure manner.

According to a further embodiment, a plurality of different optical modules (in particular with different functionalities and/or adapters) are mounted on the RDL of the component carrier. The different optical modules may be electrically connected with stack(s)/component carrier(s) and communicate with each other and/or the component embedded in the cavity below the RDL arranged above the component carrier. This embodiment may further realize a communication between optical modules/components and electronic components in a shorter path as a co-package optical path. It may allow a high-speed transmission and communication of a signal with low latency and may also significantly improve the data computing amount.

According to another exemplary embodiment, the at least one mounting protrusion is shaped as a pillar protruding beyond a planar area surrounding of the mounting region. With a mounting protrusion shaped as a pillar a direct and short path for electrical signals between layers is provided, therefore reducing the resistance and improving the signal integrity. Besides that, the mounting protrusion shaped as a pillar may be used as a thermal via, which facilitates the transfer of the heat from one layer to another.

According to another exemplary embodiment, the at least one mounting protrusion has a height of at least 20 μm, in particular at least 50 μm. With such a configuration of the mounting protrusion, extending very long into a direction of main extension, a more stable interconnection may be enabled, since the protrusion may be introduced deeper into the associated recess.

According to another exemplary embodiment, the at least one mounting protrusion has a width of at least 20 μm, in particular at least 50 μm. The width of the mounting protrusion may correspond to a width of the mounting recess, that ensures a tight connection in the width direction of the mounting region. Alternatively, the width of the mounting protrusion may be narrower than the width of the mounting recess. The position of the component (mounting recess) may be adjusted with respect to the component carrier (mounting protrusion) during the manufacturing process.

According to another exemplary embodiment, the at least one mounting protrusion has a length of at least 20 μm, in particular at least 50 μm. While the height of the protrusion may be in the direction of main extension, the extension along width and/or length may be (significantly) shorter. Nevertheless, there may also be an example, where the protrusion comprises two directions of main extension or even three. Hereby, the protrusion may have (essentially) the same extension in each special direction (x, y, z).

According to another exemplary embodiment, the at least one mounting protrusion is formed by additive manufacturing (e.g., 3D printing or (laser) sintering). This may allow manufacturing complex geometric microstructures of the mounting protrusions.

According to another exemplary embodiment, the at least one mounting recess and/or the at least one mounting protrusion has straight or slanted sidewalls. The mounting protrusion with straight sidewalls has a smaller footprint and is advantageous in terms of the material saving. Besides that, such a construction of the mounting protrusion may lead to a tight connection between the component and the component carrier, when the mounting protrusion has a shape that fits to the shape of the mounting recess. In this case, a secure mechanical and efficient stable electrical connection between the component and the component carrier is provided.

With mounting protrusion having slanted sidewalls the contact area between the mounting protrusion and the mounting recess is increased, thus providing a reliable and stable mechanical and efficient electrical connection between the component and the component carrier. Moreover, it facilitates an easier placing of the component with mounting recess onto the mounting protrusion during the manufacturing process.

According to exemplary embodiment, the step of forming the mounting region further comprises: i) providing a release layer in the stack; ii) forming at least one cover layer structure (e.g., an insulating stack material) above the release layer; and iii) removing (e.g., by drilling such as mechanical or laser drilling) at least a portion of the at least one cover layer structure located above the release layer, to thereby expose the mounting region. This may provide the advantage that an established method of cavity formation may be directly used in a straightforward manner for forming the protrusion. Hereby, a release layer may be formed on top of the protrusion, so that only a portion of the cover layer structure has to be removed to expose the protrusion.

According to another exemplary embodiment, the stack and the at least one mounting protrusion are manufactured in the same build-up process. Thereby, costs and materials may be saved.

According to another exemplary embodiment, forming the at least one mounting protrusion comprises removing a portion of the stack, in particular by drilling, routing, or etching. In this regard, highly-precise shapes of the mounting protrusions may be achieved in a reliable manner.

According to another exemplary embodiment, forming the at least one mounting protrusion comprises additive manufacturing. This may allow creation of high-precision and complex geometries of the mounting protrusions ensuring their robustness and therefore facilitating a reliable connection between the component carrier and the component, which enhances the functionality and the performance of the component.

According to another embodiment, the core of the component carrier may be a detachable core, i.e., a temporary carrier, used during the manufacture process. In such an embodiment, the stack and cavity within may be formed on said detachable core. The detachable core may comprise two opposite main surfaces and each main surface may serve as a base to build up a stack with a cavity. A respective component can then be placed in each cavity at the detachable core. After production is completed, two (finished) component carriers can be detached from the detachable core. Thereby, cost efficiency may be improved and/or a symmetric structure for deduct the warpage of the product may be provided. In particular during the manufacturing process, the two component carriers with the detachable core in between may represent a thick structure that is stable against warpage.

According to another embodiment, the component carrier is a core-less component carrier (in particular manufactured on a detachable core).

According to another embodiment, between the mounting protrusion and the mounting recess may be arranged a filling medium (not especially between the contacting area, however located at least partly on the sidewall). The filling medium may also be located at the mounting region between the layer stack and the component.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board. Alternatively, the component may be intended in the stack, however not totally embedded. Thereby, sidewalls of the component may be exposed (or not exposed) beyond the surface of the stack.

In an embodiment, the component carrier is configured as one of the group consisting of a printed circuit board, a substrate (in particular an IC substrate), and an interposer.

In the context of the present document, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present document, the term "substrate" may particularly denote a small component carrier. A substrate may be a, in relation to a PCB, comparably smaller component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as a component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, Melamine derivates, Polybenzoxabenzole (PBO), bismaleimide-triazine resin, polyphenylene derivate (e.g., based on polyphenylenether, PPE), polyimide (PI), polyamide (PA), liquid crystal polymer (LCP), polytetrafluoroethylene (PTFE), Bisbenzocyclobutene (BCB) and/or a combination thereof. Reinforcing structures such as webs, fibers, spheres, or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame-retardant properties. Although prepreg particularly FR4 are usually preferred for rigid PCBs, other materials, in particular epoxy-based build-up materials (such as build-up films) or photoimageable dielectric materials, may be used as well. For high-frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular materials coated with supra-conductive material or conductive polymers, such as graphene or poly (3,4-ethylenedioxythiophene) (PEDOT), respectively.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs), InP and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be surface mounted on the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core)

or may be a paramagnetic element. However, the component may also be an IC substrate, an interposer or a further component carrier, for example in a board-in-board configuration. The component may be surface mounted on the component carrier. Moreover, other components, in particular those which generate and emit electromagnetic radiation and/or are sensitive with regard to electromagnetic radiation propagating from an environment, may be used as a component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the disclosure are apparent from the examples of embodiment to be described hereinafter and are explained with reference to these examples of embodiment.

DETAILED DESCRIPTION OF ILLUSTRATED EMBODIMENTS

Figure 1:
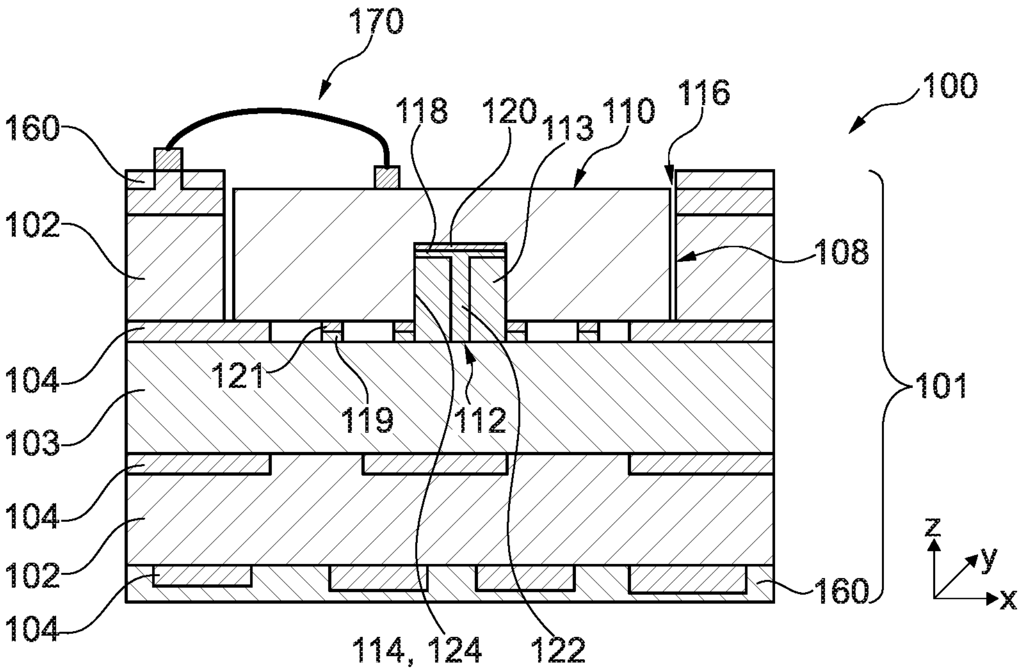
FIG. 1 illustrates a cross-sectional view of a component carrier with a component mounted thereon, according to an exemplary embodiment of the disclosure.

The illustrations in the drawings are schematically presented. In different drawings, similar or identical elements are provided with the same reference signs.

FIG. 1 illustrates a cross-sectional view of a component carrier 100 with a component 110 mounted thereon, according to an exemplary embodiment of the disclosure. For instance, the component carrier 100 according to FIG. 1 is embodied as an integrated circuit (IC) or as a printed circuit board (PCB).

As shown, component carrier 100 comprises a layer stack 101 having two electrically insulating layer structures 102 and a plurality of electrically conductive layer structures 104. Thereby, in this example, the conductive layer structures 104 are arranged as a discontinuous layer. Further, the stack 101 comprises a core layer structure 103 (e.g., a fully cured resin such as FR4) arranged between the two central electrically conductive layer structures 104. In a different example, the core layer structure 103 may comprise a plurality of electrically insulating layers (a multi-layer core; not shown). Respective surface layers 160 (e.g., a solder resist or a surface finish, for example gold or tin) are arranged at the top and at the bottom of the stack 101. The stack 101 is provided with electric contacts 119 arranged on the core layer structure 103 and being in contact with further electrically conductive structure 121, in particular further electrical pads 121 of a component 110 mounted on the stack 101.

The component carrier 100 is provided with a cavity 116 arranged in the stack 101 and comprising a mounting region 108 configured for mounting the component 110. Thereby, the mounting region 108 comprises a mounting protrusion 112 arranged on the core layer structure 103 in the middle of the bottom of the cavity 116. The mounting protrusion 112 comprises a vertical through connection 122 extending vertically (along axis z) in the cavity 116, an electric contact 118 arranged on top of the vertical through connection 122, and an electrically insulating portion 113 located on both sides of the vertical through connection 122 and below the electric contact 118. Further, the mounting protrusion 112 is provided with an electrically conductive structure, in particular electric pad 120 connected with the electric contact 118. Thus, the electrically conductive structure 120 electrically connects the component carrier 100 with the component 110 through the electric contact 118.

The component 110 comprises a mounting recess 114 arranged in the middle of the component 110, so that the mounting protrusion 112 is inserted into the mounting recess 114. In this example, the width of the mounting protrusion 112 essentially corresponds to the width of the mounting recess 114. Further, the width and height of the mounting protrusion 112 are in this example essentially the same.

Furthermore, the component carrier 100 (the stack 101) is further electrically connected to the component 110 by means of the further electric contact 119 arranged at the core layer structure 103 and the further electrically conductive structure 121 arranged at the component 110. There are four connections in this example between the further electric contact 119 and the further electrically conductive structure 121. These contacts are arranged on both sides (in the horizontal direction x) of the mounting protrusion 112. The further electric contact 119 and the further electrically conductive structure 121 (on top of each other) are flush with the corresponding electrically conductive layer structure 104.

The component 110 is further optically connected to the stack 101 through an optical fiber 170 for optical signal transmission.

Figure 2:
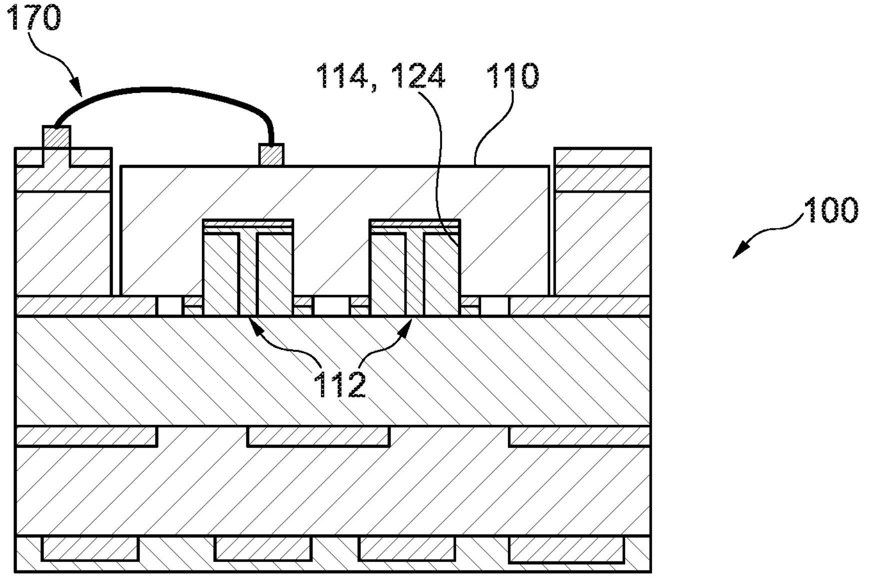
FIG. 2 illustrates a cross-sectional view of a component carrier with a component mounted thereon, according to a further exemplary embodiment of the disclosure.

FIG. 2 illustrates a cross-sectional view of a component carrier 100 with a component 110 mounted thereon, according to another exemplary embodiment of the disclosure. In this embodiment, the component carrier 100 comprises two mounting protrusions 112 arranged at essentially the same distance from sidewalls of the cavity 116, respectively, and extending in parallel with respect to each other from the core layer structure 103 on the bottom of the cavity 116 in the vertical direction. In this example, the widths of the mounting protrusion 112 and the widths of the vertical through connections 122 are essentially equal. The component 110 is respectfully provided with two mounting recesses 114 so that each mounting protrusion 112 is inserted into the associated mounting recess 114.

Thus, the component carrier 100 is electrically connected to the component 110 at the mounting region 108 by means of respective electric contacts 118 of mounting protrusions and the electrically conductive structures 120 of the component 110. Furthermore, the component carrier 100 is further electrically connected to the component 110 by means of the further electric contact 119 arranged at the core layer structure 103 and the further electrically conductive structure 121 arranged at the component 110. There are two connections between the further electric contact 119 and the further electrically conductive structure 121, one connection at each side (in the horizontal direction) of each mounting protrusion 112. Thereby, these contacts are in direct contact with the associated mounting protrusion 112. Moreover, the component carrier 100 and the component 110 are also connected by means of the optical fiber 170. An optical signal is provided over the mounting protrusion 112 to the component 110.

Figure 3:
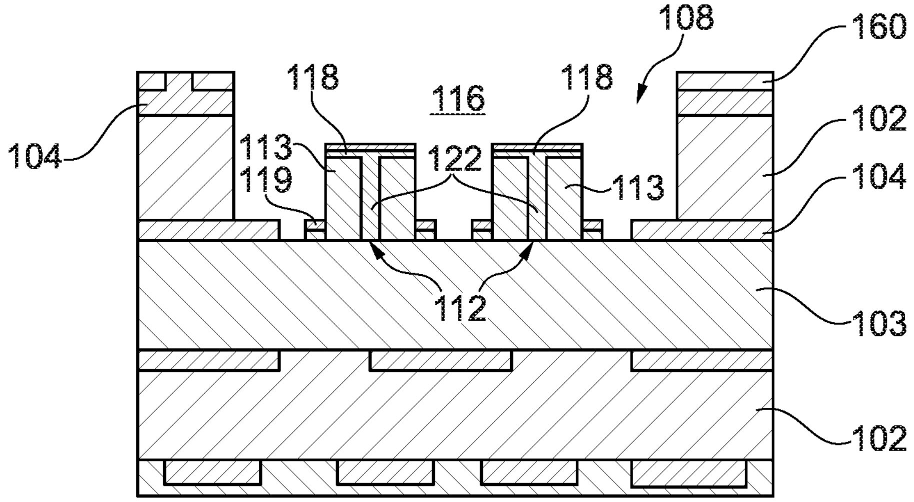
FIG. 3 illustrates a cross-sectional view of a component carrier provided with a mounting region without a component mounted thereon, according to an exemplary embodiment of the disclosure.

FIG. 3 illustrates a cross-sectional view of a component carrier 100 provided with a mounting region 108 without a component 110 (as described for FIGS. 1 and 2 above) mounted thereon, according to an exemplary embodiment of the disclosure.

Figure 4:
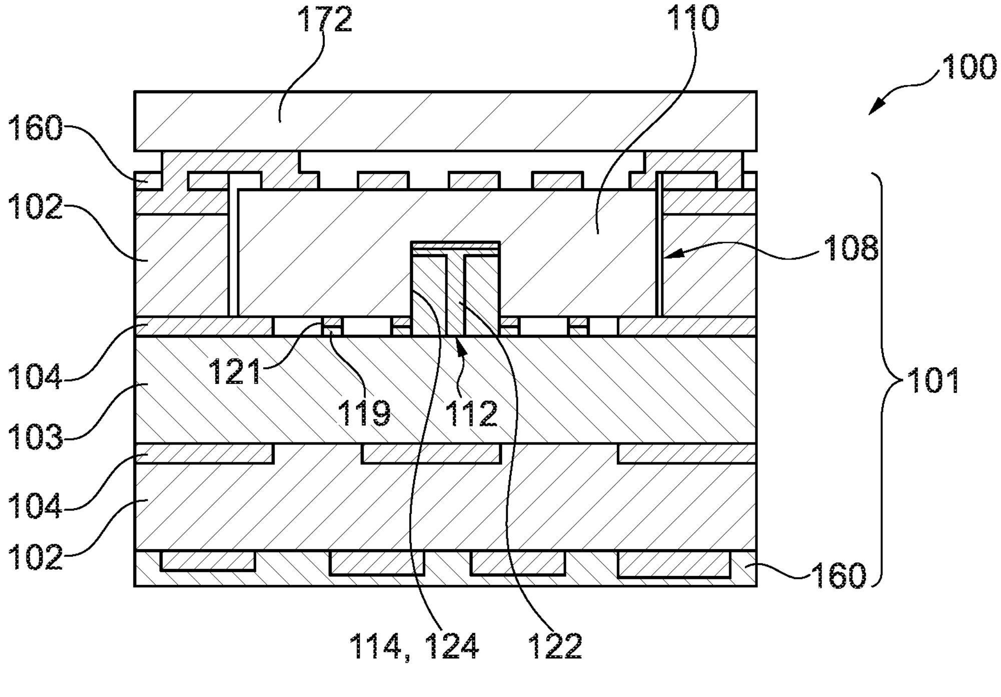
FIG. 4 illustrates a cross-sectional view of a component carrier a with a component mounted thereon and a redistribution layer, according to another exemplary embodiment of the disclosure.

FIG. 4 illustrates a cross-sectional view of a component carrier 100 connected with the stack 101 by means of a redistribution layer 172. The component 110 comprises at the upper main surface electrically conductive layer structures (like electric contacts 120, 121 at the lower main surface). The outermost of these electrically conductive layer structures (in the horizontal direction) are respectively electrically connected to another electrically conductive layer structure mounted on top of the surface layer 160. The redistribution layer 172 covers the entire upper main surface of the component 110 and part of the stack 101 upper main surface. Hereby, the redistribution layer 172 is electrically connected via the electrically conductive layer structures to the component 110.

FIGS. 5A to 5G illustrate cross-sectional views of structures obtained during carrying out a method of manufacturing a component carrier, according to an exemplary embodiment of the disclosure.

Figure 5A:
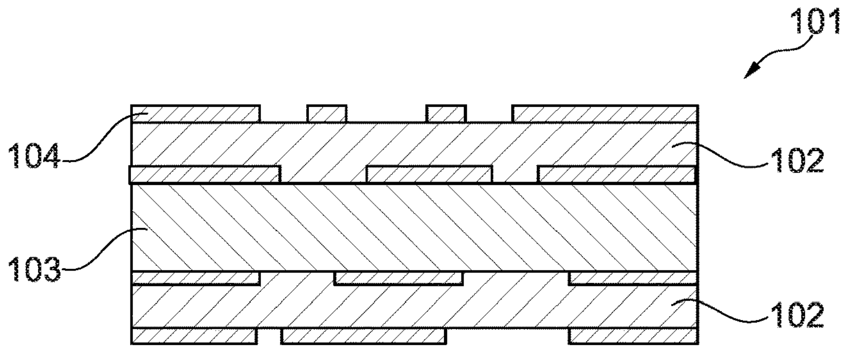
FIG. 5A, FIG. 5B, FIG. 5C, FIG. 5D, FIG. 5E, FIG. 5F, and FIG. 5G illustrate cross-sectional views of structures obtained during carrying out a method of manufacturing the component carrier, according to an exemplary embodiment of the disclosure.

FIG. 5A illustrates a stack 101 comprising the electrically insulating layer structures 102, the electrically conductive layer structures 104 and a core layer structure 103 placed between (sandwiched) the electrically insulating layer structures 102 and the conductive layer structures 104.

Figure 5B:
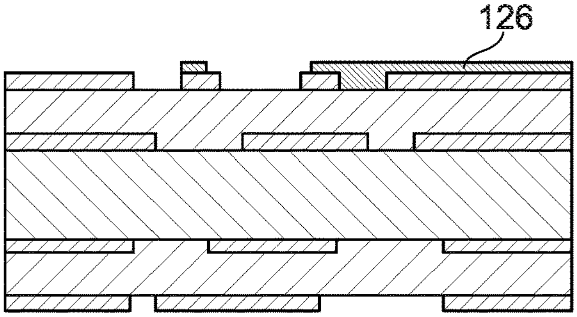

FIG. 5B illustrates the stack 101 according to FIG. 5A with a release layer 126 partly arranged on the traces of the conductive layer structure 104 and partly on the electrically insulating layer structure 102.

Figure 5C:
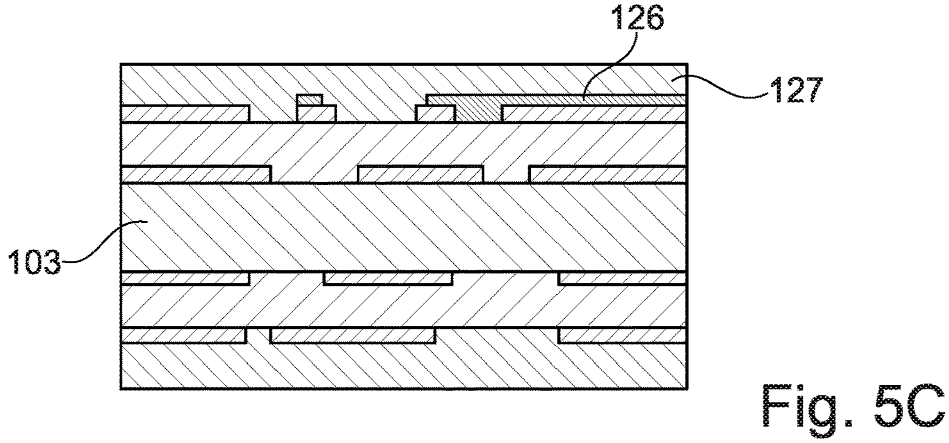
Figure 5D:
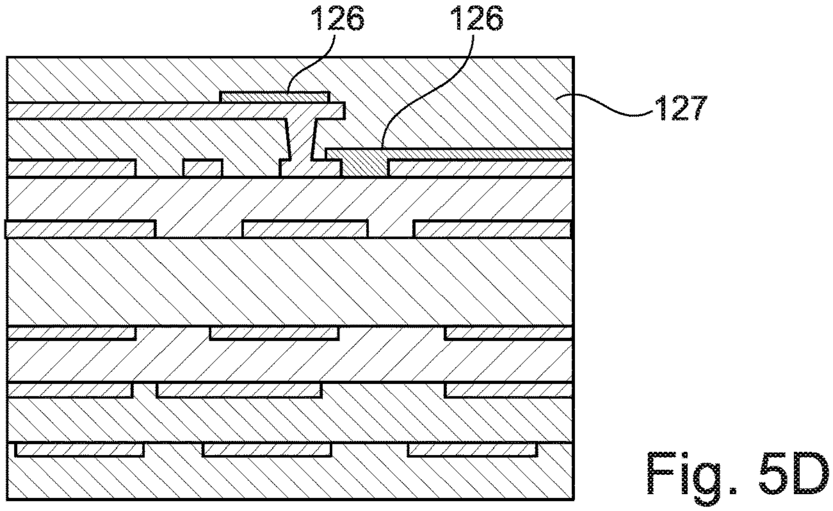

FIG. 5C and FIG. 5D respectively illustrate a stack 101 according to FIG. 5B provided with a cover layer structure 127 arranged partially on the release layer 126 and partially on the electrically insulating layer structure 102 and the electrically conductive layer structure 104. Thereby, the thickness of the cover layer structure 127 varies depending on the preferred dimensions of the cavity 116 to be formed.

Figure 5E:
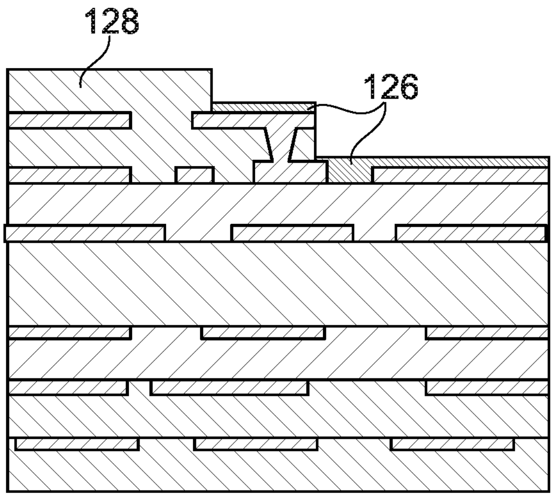

FIG. 5E illustrates a stack 101 comprising the cavity 116 formed by removing the cover layer structure 127 arranged above the release layer 126 (e.g., cut out by laser drilling). A remaining portion of the cover layer structure 127 is arranged on the electrically insulating layer structure 102 and the electrically conductive layer structure 104.

Figure 5F:
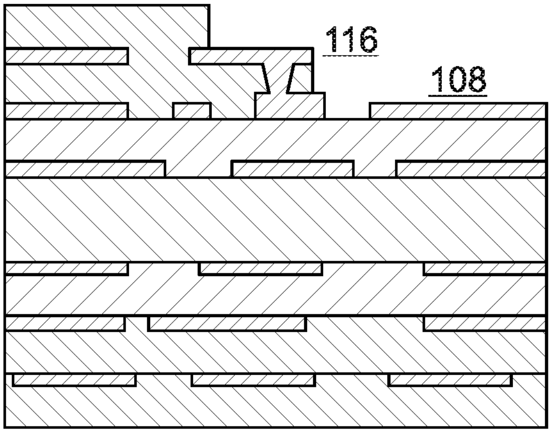

FIG. 5F illustrates the stack 101 comprising a cavity 116 in the preferred form. Thereby, the cavity 116 comprises the mounting region 108 for secure mounting and electrically connecting the component carrier 100 and the component 110.

Figure 5G:
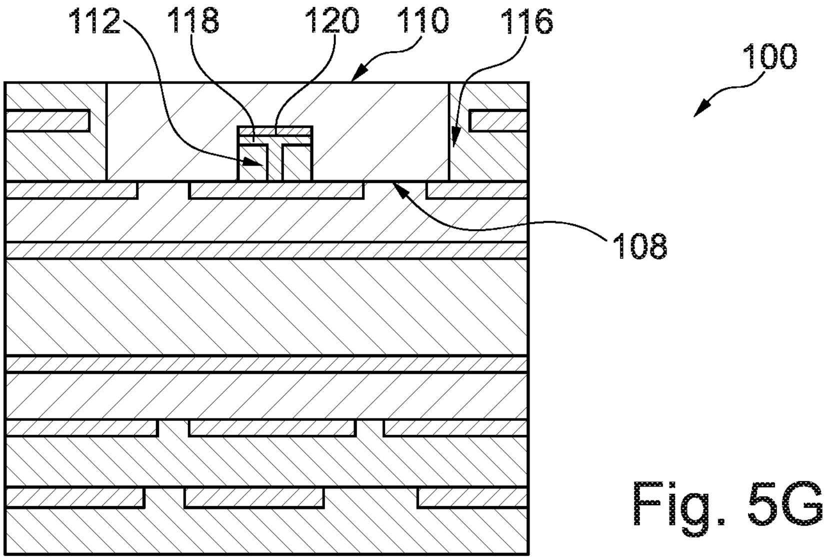

FIG. 5G illustrates the component 110 mounted on the stack 101 of the component carrier 100 at the mounting region 108. Thereby, the mounting protrusion 112 ensures a secure mechanical, efficient and stable electrical connection between the component carrier 100 and the component 110. In this example, the width of the mounting protrusion 112 is larger than its height. Moreover, an exposed surface of the stack 101 (top surface) is at the same vertical height (stack thickness level) as the exposed surface of the component 110.

Figure 6:
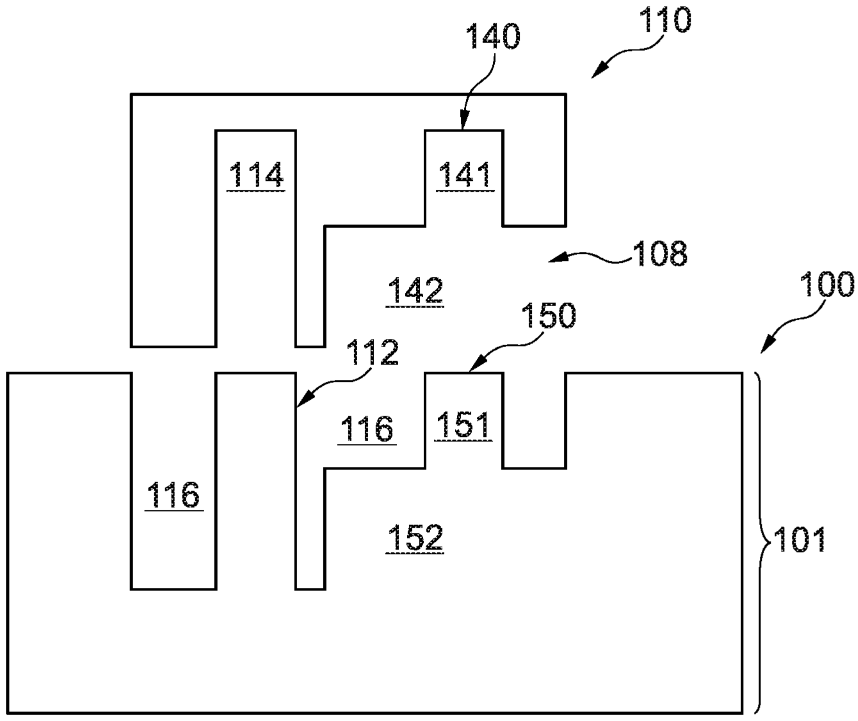
FIG. 6 illustrates a cross-sectional view of a component carrier comprising two mounting protrusions and a component comprising two mounting recesses, according to an exemplary embodiment of the disclosure.

FIG. 6 illustrates the component carrier 100 comprising a stack 101 and a mounting region 108 provided with two mounting protrusions 112. Thereby, the mounting protrusions 112 have different shapes with respect to each other. While the left mounting protrusion 112 comprises a pillar-shape, a further (right) mounting protrusion 150 comprises two parts: i) an upper pillar-shaped part 151, and ii) a lower part 152 with a larger width that can be termed an "elevation structure". Both mounting protrusions 112, 150 extend from the same horizontal levels at the bottom of the cavity 116 in the vertical direction z and end at the same level corresponding to the level of the surface of the stack 101.

Further, a corresponding component 110 comprises corresponding mounting recesses. While the left recess is pillar-shaped to fit to the pillar-shape of the left mounting protrusion 112, a further (right) mounting recess 140 comprises two parts: i) a lower part 142 with a larger width, and ii) an upper part 141 with a narrower width to fit to the right mounting protrusion 150 that comprises two corresponding parts. Accordingly, the mounting recesses 114, 140 of the component 110 perfectly fit together with the mounting protrusions 112, 150 of the component carrier 100.

Figure 7:
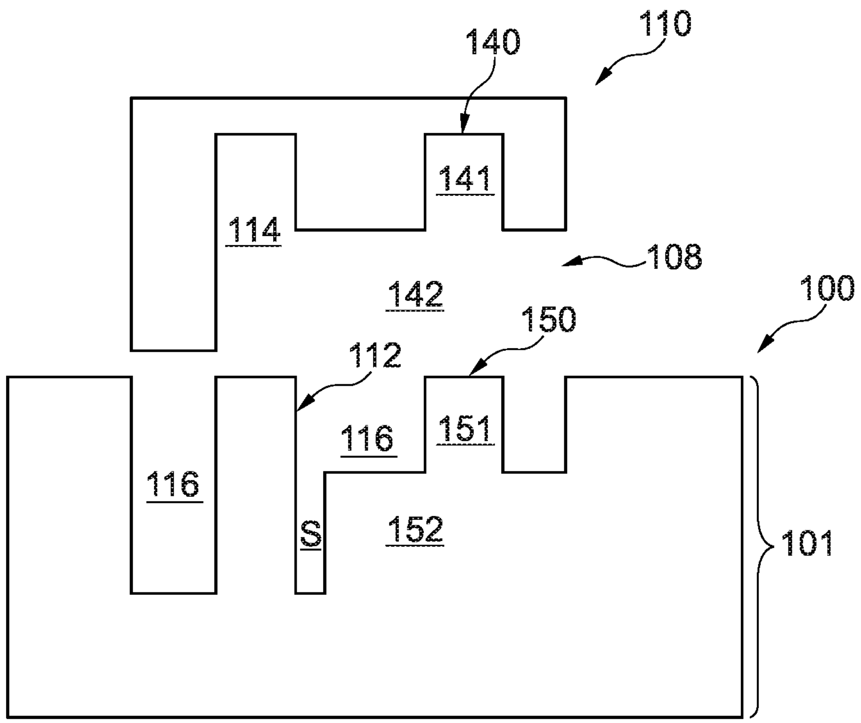
FIG. 7 illustrates a cross-sectional view of a component carrier comprising two mounting protrusions and a component comprising two mounting recesses, according to another exemplary embodiment of the disclosure.

FIG. 7 illustrates a component carrier 100 that is comparable to the component carrier shown in FIG. 6. Yet, in contrast to FIG. 6, the component 100 shown in FIG. 7 comprises a different shape (missing the recess in the middle), so that, by connecting the component carrier 100 and the component 110, there remains a free space S in the cavity 116 of the component carrier 100 which is filled by fluid (air) 176. In other words, the component carrier 100 and the component 110 do not have to comprise strictly positive-negative shapes that perfectly fit together. Instead, there can be embodiments, where there are protrusions and/or recesses without a corresponding structure, so that a fluid-filled (or insulating material filled) space remains after connecting component 110 and component carrier 100. The fluid (air) can be seen as a dielectric medium with a low Dk. Therefore, the speed and frequency of signal transmission can be efficiently improved.

Figure 8:
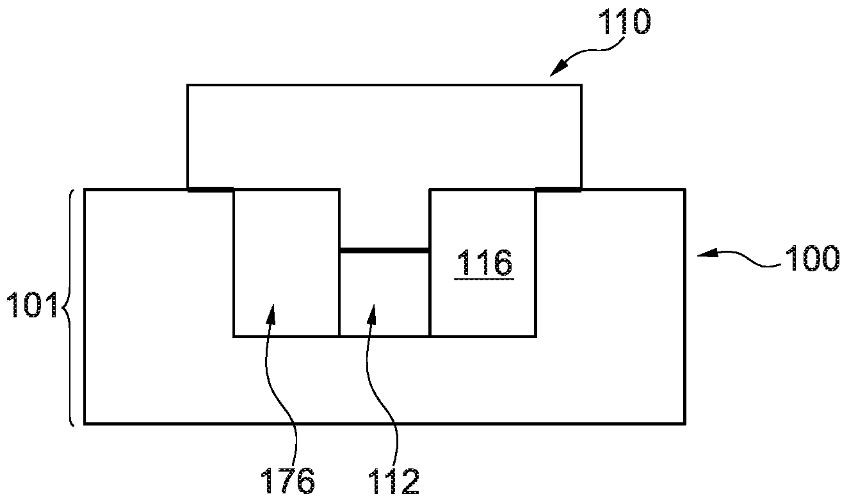
FIG. 8 illustrates a cross-sectional view of a component carrier comprising a mounting protrusion, a component mounted on the component carrier, and air cavities, according to an exemplary embodiment of the disclosure.

FIG. 8 illustrates a component carrier 100 comprising a mounting protrusion 112 arranged in a cavity 116 and a component 110 mounted on the component carrier 100. In this example, surfaces of end parts of the component 110 and the component carrier 100 are electrically connected. Thereby, the component 110 comprises a component mounting protrusion extending from the middle of the lower main surface of the component 110 in the vertical direction down to the mounting protrusion 112 of the component carrier 100 and can be electrically connected. The component 110 is placed like a lid on the top edges of the cavity 116. It can be seen that free space 176 remains in the cavity 116 to the left and to the right of the connection between the mounting protrusion 112 and the component mounting protrusion. In this example, the free space is filled with fluid, in particular air.

Figure 9:
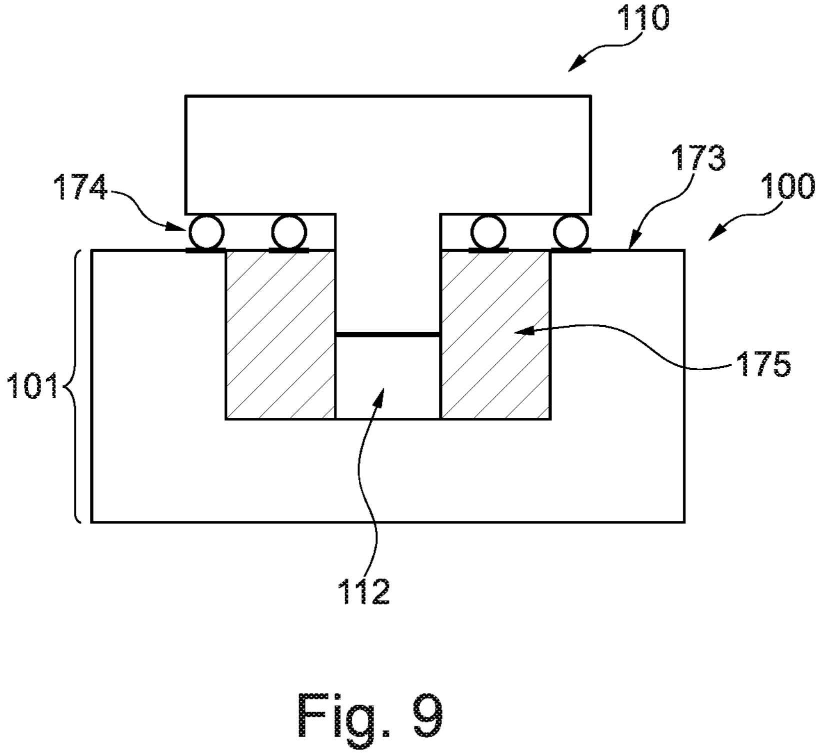
FIG. 9 illustrates a cross-sectional view of a component carrier comprising a mounting protrusion, a component mounted on the component carrier, and resin filled cavities, according to an exemplary embodiment of the disclosure.

FIG. 9 illustrates a component carrier 100 comprising a mounting protrusion 112 and a component 110 connected to the component carrier 100 at three contact regions. The architecture is comparable to FIG. 8, yet the component 110 is not directly placed on top of the cavity 116 edges of the component carrier 100. Instead, solder balls 174 (large electric contacts) are arranged between the component 110 and the component carrier 100, enabling an electrical connection together with the electrical connection between the mounting protrusion 112 and the component mounting protrusion. Further, in contrast to FIG. 8, the space in the cavity 116 is filled with an encapsulated dielectric material 175. A surface finish layer 173 is provided on the component carrier 100.

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

REFERENCE SIGNS

100 component carrier
101 stack
102 electrically insulating layer structure
103 core layer structure
104 electrically conductive layer structure
108 mounting region
110 component
112 mounting protrusion
113 electrically insulating portion of mounting protrusion
114 mounting recess of component
116 cavity
118 electric contact of mounting protrusion
119 further electric contact of mounting region
120 electrically conductive structure of component
121 further electrically conductive structure of component
122 vertical through connection of mounting protrusion
124 sidewalls of mounting protrusion
126 release layer
127 cover layer structure
128 remaining portion of cover layer structure
140 further mounting recess
141 upper part of further mounting recess
142 lower part of further mounting recess
150 further mounting protrusion
151 upper part of further mounting protrusion
152 lower part of further mounting protrusion
160 surface layer
170 optical fiber
172 redistribution layer
173 surface finish layer
174 solder ball, bond structure
175 dielectric material
176 fluid, air

The invention claimed is:

1. A component carrier, comprising:
a stack comprising at least one electrically conductive layer structure and at least one electrically insulating layer structure; and
a mounting region arranged at the stack, configured for mounting a component thereon, and the mounting region comprising:
at least one mounting protrusion for insertion of the component by accommodating at least a part of the mounting protrusion in at least one mounting recess of the component,
wherein the component carrier is configured as a panel.

2. The component carrier according to claim 1,
wherein the component mounted at the mounting region is an electronic component.

3. The component carrier according to claim 1,
wherein the component is a thermally conductive block.

4. The component carrier according to claim 2,
wherein the at least one mounting protrusion is configured for dissipating heat when the component is mounted at the mounting region with the at least one mounting protrusion inserted in the at least one mounting recess.

5. The component carrier according to claim 2,
wherein the mounting region comprises at least two mounting protrusions,
wherein the component comprises at least two mounting recesses, and
wherein each mounting protrusion is at least partially inserted into an associated mounting recess.

6. The component carrier according to claim 1, further comprising:
a cavity in the stack,
wherein the mounting region is at least partially located in the cavity.

7. The component carrier according to claim 6,
wherein the mounting protrusion is arranged at the bottom of the cavity.

8. The component carrier according to claim 6,
wherein the mounting protrusion extends within the volume of the cavity, wherein the extension of the mounting protrusion is restricted by the volume of the cavity.

9. The component carrier according to claim 1,
wherein the mounting protrusion comprises at least one vertical through connection.

10. The component carrier according to claim 1,
wherein the mounting region is at least partially located at an exterior main surface of the stack.

11. The component carrier according to claim 1,
wherein the at least one mounting protrusion comprises:
at least one electric contact for electrically contacting at least one electrically conductive structure of the component when the at least one mounting protrusion is inserted in the at least one mounting recess.

12. The component carrier according to claim 11,
wherein the electric contact is an electrically conductive structure and/or an electrical pad.

13. The component carrier according to claim 11,
wherein the electric contact is arranged on a top of the mounting protrusion.

14. The component carrier according to claim 2,
wherein the component comprises at least one further electrically conductive structure being electrically connected with at least one further electric contact provided at the mounting region apart from the at least one mounting protrusion.

15. The component carrier according to claim 14,
wherein the further electrically conductive structure is one of a slanted connection, a via, a pillar, and a bump.

16. The component carrier according to claim 2,
wherein the stack is electrically connected with the component by a redistribution layer.

17. The component carrier according to claim 2, comprising at least one of the following features:
wherein the at least one mounting protrusion is configured for contributing to a transmission of an electrical signal between the component and the stack;
wherein the component carrier comprises an optical interface for supplying an optical signal at a sidewall of the stack to the component;
wherein the component carrier comprises an optical path, which is optically coupling the component with the stack, wherein the optical path is arranged at least partially outside of the stack.

18. The component carrier according to claim 1, comprising at least one of the following features:
wherein the at least one mounting protrusion is shaped as a pillar protruding beyond a planar surrounding of the mounting region;
wherein the at least one mounting protrusion has a height of at least 20 μm;
wherein the at least one mounting protrusion has a width of at least 20 μm;
wherein the at least one mounting protrusion is formed by additive manufacturing;
wherein the at least one mounting protrusion comprises at least one vertical through connection;
wherein the at least one mounting recess and/or the at least one mounting protrusion has straight sidewalls.

19. A method of manufacturing a component carrier, comprising:
providing a stack comprising at least one electrically conductive layer structure and at least one electrically insulating layer structure; and
forming a mounting region at the stack, wherein forming the mounting region comprises
forming at least one mounting protrusion, configured for insertion of the mounting protrusion into at least a portion of a mounting recess of a component, and
arranging the component in the component carrier,
wherein the component carrier is configured as a panel.

20. The method according to claim 19, comprising at least one of the following features:
wherein forming the mounting region further comprises:
providing a release layer in the stack,
forming at least one cover layer structure above the release layer, and
removing at least a portion of the at least one cover layer structure located above the release layer, to thereby expose the mounting region;
wherein the stack and the at least one mounting protrusion are manufactured in the same build-up process;
wherein forming the at least one mounting protrusion comprises additive manufacturing or a semi-additive process.

* * * * *